US012751238B2

(12) United States Patent
Oh et al.

(10) Patent No.: US 12,751,238 B2
(45) Date of Patent: Sep. 29, 2026

(54) DEVICE FOR REMOVING VOID IN UNDERFILL MATERIAL

(71) Applicant: Samsung Electronics Co., Ltd., Suwon-si (KR)

(72) Inventors: Geunsik Oh, Suwon-si (KR); Sang-Yoon Kim, Suwon-si (KR); Sung-Ki Lee, Suwon-si (KR); Myung-Sung Kang, Suwon-si (KR); Jin-Woo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/800,266

(22) Filed: Aug. 12, 2024

(65) Prior Publication Data

US 2025/0259866 A1 Aug. 14, 2025

(30) Foreign Application Priority Data

Feb. 13, 2024 (KR) ........................ 10-2024-0020612

(51) Int. Cl.
*H01L 21/67* (2006.01)
*H10P 72/00* (2026.01)

(52) U.S. Cl.
CPC ................................ *H10P 72/0441* (2026.01)

(58) Field of Classification Search
None
See application file for complete search history.

(56) References Cited

U.S. PATENT DOCUMENTS 5,710,071 A 1/1998 Beddingfield et al.
6,000,924 A 12/1999 Wang et al.
6,048,656 A 4/2000 Akram et al.
6,119,895 A 9/2000 Fugere et al.
6,245,583 B1 * 6/2001 Amador ................ H01L 24/743 257/E21.503
6,352,878 B1 3/2002 Mostafazadeh et al.
6,969,839 B2 11/2005 Costello
7,238,547 B2 7/2007 Jones et al.
(Continued)

FOREIGN PATENT DOCUMENTS

JP 11121484 4/1999
KR 20070070752 A 7/2007
KR 102 448 321 B1 * 9/2022

*Primary Examiner* — Mohammad M Ameen
(74) *Attorney, Agent, or Firm* — Wolf, Greenfield & Sacks, P.C.

(57) ABSTRACT

A device for removing a void in an underfill material is described. The device includes a chamber configured to accept a substrate applied with an underfill material therein; a gas supply device connected to the chamber and configured to inject a heated gas into the chamber to create a heating atmosphere and a pressurizing atmosphere inside the chamber; and a vacuum device connected to the chamber and configured to exhaust a gas to the outside of the chamber to create a vacuum atmosphere inside the chamber. The vacuum device and the gas supply device are configured to alternately operate once during each cycle of one or more cycles to create the vacuum atmosphere and the pressurizing atmosphere inside the chamber, and during each cycle of the one or more cycles, the vacuum device and the gas supply device are configured to alternately operate once. Related methods are also described.

20 Claims, 16 Drawing Sheets

(56) References Cited

U.S. PATENT DOCUMENTS

| | | | | |
|---|---|---|---|---|
| 7,459,339 | B2 | 12/2008 | Masumoto | |
| 7,614,888 | B2 | 11/2009 | Tong et al. | |
| 7,687,319 | B2 | 3/2010 | Nishimura et al. | |
| 7,763,984 | B2 | 7/2010 | Kim et al. | |
| 7,791,209 | B2 | 9/2010 | Hisada et al. | |
| 8,138,018 | B2 | 3/2012 | Oi et al. | |
| 8,247,895 | B2 | 8/2012 | Haensch et al. | |
| 8,278,142 | B2 | 10/2012 | Takahashi | |
| 8,288,177 | B2 | 10/2012 | Gaynes et al. | |
| 8,399,305 | B2 | 3/2013 | Huang et al. | |
| 8,551,813 | B2 | 10/2013 | Lee et al. | |
| 8,591,659 | B1 * | 11/2013 | Fang ................. | H01J 37/32862<br>134/1.1 |
| 8,759,221 | B2 | 6/2014 | Park et al. | |
| 8,796,075 | B2 | 8/2014 | Babiarz et al. | |
| 9,314,882 | B2 | 4/2016 | Babiarz et al. | |
| 2004/0149888 | A1 | 8/2004 | Costello | |
| 2006/0099736 | A1 | 5/2006 | Nagar et al. | |
| 2006/0220654 | A1 | 10/2006 | Zabel et al. | |
| 2007/0117264 | A1 | 5/2007 | Masumoto | |
| 2009/0001605 | A1 | 1/2009 | Kim et al. | |
| 2009/0087947 | A1 | 4/2009 | Tong et al. | |
| 2009/0229513 | A1 | 9/2009 | Hisada et al. | |
| 2009/0230566 | A1 | 9/2009 | Hisada et al. | |
| 2009/0291524 | A1 | 11/2009 | Takahashi | |
| 2010/0255641 | A1 | 10/2010 | Nakanishi et al. | |
| 2011/0170266 | A1 | 7/2011 | Haensch et al. | |
| 2011/0300673 | A1 | 12/2011 | Mercado et al. | |
| 2012/0045853 | A1 | 2/2012 | Gaynes et al. | |
| 2012/0068353 | A1 | 3/2012 | Huang et al. | |
| 2012/0178219 | A1 | 7/2012 | Babiarz et al. | |
| 2012/0288998 | A1 | 11/2012 | Lee et al. | |
| 2012/0295405 | A1 | 11/2012 | Babiarz et al. | |
| 2013/0288431 | A1 | 10/2013 | Park et al. | |
| 2014/0183248 | A1 | 7/2014 | Babiarz et al. | |
| 2016/0141268 | A1 | 5/2016 | Nakamura et al. | |
| 2016/0189984 | A1 | 6/2016 | Babiarz et al. | |
| 2018/0247834 | A1 | 8/2018 | Tsuda et al. | |
| 2023/0178445 | A1 | 6/2023 | Aoki et al. | |

* cited by examiner (a) (b) (c)

DEVICE FOR REMOVING VOID IN UNDERFILL MATERIAL

CROSS-REFERENCE TO RELATED APPLICATION

This application claims priority to and the benefit of Korean Patent Application No. 10-2024-0020612 filed at the Korean Intellectual Property Office on Feb. 13, 2024, the entire contents of which are incorporated herein by reference.

BACKGROUND OF THE INVENTION

(a) Field of the Invention

The present disclosure relates to a device for removing a void in an underfill material and related methods.

(b) Description of the Related Art

A capillary underfill (CUF) process is a process that fills a space between a substrate and an electronic component with an underfill solution using a capillary force. The CUF process is mainly carried out in an atmospheric pressure atmosphere, and the underfill solution moves forward by filling the space between the substrate and the electronic component with the capillary force. In this case, a speed difference for each position of the underfill solution may occur due to presence of a plurality of solder balls disposed between the substrate and the electronic component, and a void that is a pore surrounded by an underfill material may occur. The void may also be affected by a spraying position and a spraying amount of the underfill solution, a surface state of the substrate, positions of the solder balls, and the like.

As the electronic component becomes highly integrated, a size of the solder ball decreases and the number of the solder balls increases. This is a factor that increases a possibility of occurrence of voids. Because voids having the underfill material may affect reliability of a product, it may be advantageous to reduce or minimize voids.

SUMMARY OF THE INVENTION

An aspect of the present disclosure is to provide a device for removing a void in an underfill material.

A device for removing a void in an underfill material according to embodiments of the present disclosure includes a chamber configured to accept a substrate applied with an underfill material therein; a gas supply device connected to the chamber and configured to inject a heated gas into the chamber to create a heating atmosphere and a pressurizing atmosphere inside the chamber; and a vacuum device connected to the chamber and configured to exhaust a gas from the inside of the chamber to outside of the chamber to create a vacuum atmosphere inside the chamber. The vacuum device and the gas supply device are configured to alternately operate for one or more cycles to create the vacuum atmosphere and the pressurizing atmosphere inside the chamber, and during each cycle of the one or more cycles, the vacuum device and the gas supply device are configured to alternately operate once.

A device for removing a void in an underfill material according to embodiments of the present disclosure includes a chamber configured to accept a substrate applied with an underfill material therein; a gas supply device connected to the chamber and configured to inject a first gas into the chamber to create a pressurizing atmosphere inside the chamber; a vacuum device connected to the chamber and configured to exhaust a second gas from inside of the chamber to outside of the chamber to create a vacuum atmosphere inside the chamber; and a heating device disposed inside the chamber and configured to heat the substrate by irradiating light to the substrate. The vacuum device and the gas supply device are configured to alternately operate once during each cycle of one or more cycles to create the vacuum atmosphere and the pressurizing atmosphere inside the chamber.

A device for removing a void in an underfill material according to embodiments of the present disclosure includes a chamber configured to accept a substrate applied with an underfill material therein; a gas supply device configured to inject a first gas into the chamber to create a pressurizing atmosphere inside the chamber; and a vacuum device configured to exhaust a second gas from the inside of the chamber to outside of the chamber to create a vacuum atmosphere inside the chamber. The vacuum device and the gas supply device are configured to alternately operate once during each cycle of one or more cycles to create the vacuum atmosphere and the pressurizing atmosphere inside the chamber, and an internal pressure of the chamber in the vacuum atmosphere is 10 torr or less.

According to the aspect of the present disclosure, a device for removing a void in an underfill material capable of removing the void of the underfill material may be provided.

DETAILED DESCRIPTION OF THE EMBODIMENTS

Figure 1:
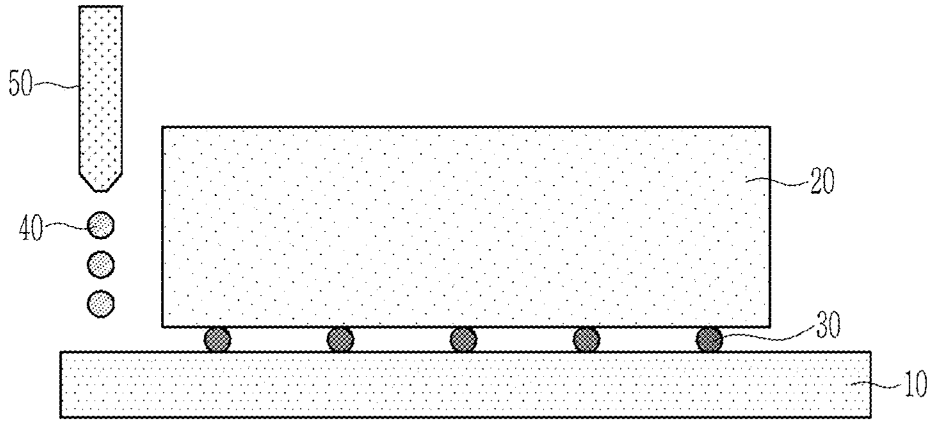
FIG. 1 and FIG. 2 are schematic views showing an exemplary underfill process.

Embodiments of the present disclosure will be described more fully hereinafter with reference to the accompanying drawings so that those skilled in the art easily implement the embodiments. The present disclosure may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

Further, in the drawings, a size of each element is arbitrarily illustrated for ease of description, and the present disclosure is not necessarily limited to those illustrated in the drawings. In the drawings, the thickness of layers, films, panels, regions, etc. are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or above the object portion, and does not necessarily mean positioned on the upper side of the object portion based on a gravitational direction.

In addition, throughout the specification, unless explicitly described to the contrary, the word "comprise" and variations such as "comprises" or "comprising" will be understood to imply the inclusion of stated elements but not the exclusion of any other elements.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

In addition, in the specification, when referring to "connected to", this does not only mean that two or more constituent elements are directly connected, but also that two or more constituent elements are electrically connected through other constituent elements as well as being indirectly connected and being physically connected, or it may mean that they are referred to by different names according to a position or function, but are integrated.

Additionally, throughout the specification, a singular reference to a component includes references to a plurality of these components, unless specifically stated to the contrary.

Hereinafter, various embodiments and variations of the present invention will be described in detail with reference to the accompanying drawings.

Figure 2:
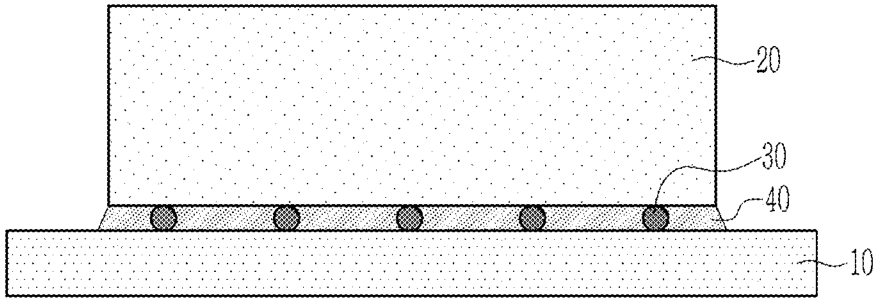

FIG. 1 and FIG. 2 are schematic views showing an exemplary underfill process.

Referring to the drawings, an underfill material 40 is applied on a substrate 10. In some embodiments, an electronic component 20 may be mounted on the substrate 10 through one or more conductive bumps 30 such as a solder ball.

In some embodiments, the substrate 10 may be a known substrate electrically connected to the electronic component 20 such as a printed circuit board (PCB) or a redistribution layer substrate.

The type of electronic component 20 is not particularly limited, and for example, in some embodiments, the electronic component 20 may be an active element such as a semiconductor chip or a transistor, or a passive element such as a capacitor. According to some embodiments of the present invention, the electronic component 20 may be mounted above the substrate 10 in a packaged form of one or more electronic components 20.

In some embodiments, a conductive material may be used as a material of the conductive bump 30, and for example, the conductive bump 30 may be a solder ball, but the present disclosure is not limited thereto. Additionally, in some embodiments, the conductive bump 30 may have various shapes such as a land, a pin, a ball, and the like.

In some embodiments, the underfill material 40 may include a thermosetting resin such as epoxy. Additionally, in some embodiments, the underfill material 40 may further include an inorganic filler such as silica ($SiO_2$), a flux, or the like.

For example, in some embodiments, the underfill material 40 may be dispensed on one side of the substrate 10 through a dispenser 50, and the dispensed underfill material 40 may fill a space residing between the substrate 10 and the electronic component 20 with a capillary force. In this case, as the underfill material 40 is being dispensed from the dispenser 50, a speed difference for each position of the underfill material 40 may occur due to presence of a plurality of conductive bumps 30 (e.g., solder balls) disposed between the substrate 10 and the electronic component 20, and a void 40V may occur (see also FIG. 3). In other words, the void 40V is a pore surrounded by the underfill material 40. In some embodiments, the void 40V may also be affected by a spraying position and a spraying amount of the underfill material 40, a surface state of the substrate 10, positions of the conductive bumps 30 (e.g., solder balls), and the like.

As the electronic component 20 becomes highly integrated, a size of the solder ball (conductive bump 30) decreases and the number of the solder balls (conductive bumps 30) increases. This is one factor that may increase the possibility of occurrence of voids 40V in the underfill material 40. Because having voids 40V in the underfill material 40 may affect the reliability of a product, an effort is needed to minimize or eliminate the voids 40V in the underfill material 40.

Figure 3:
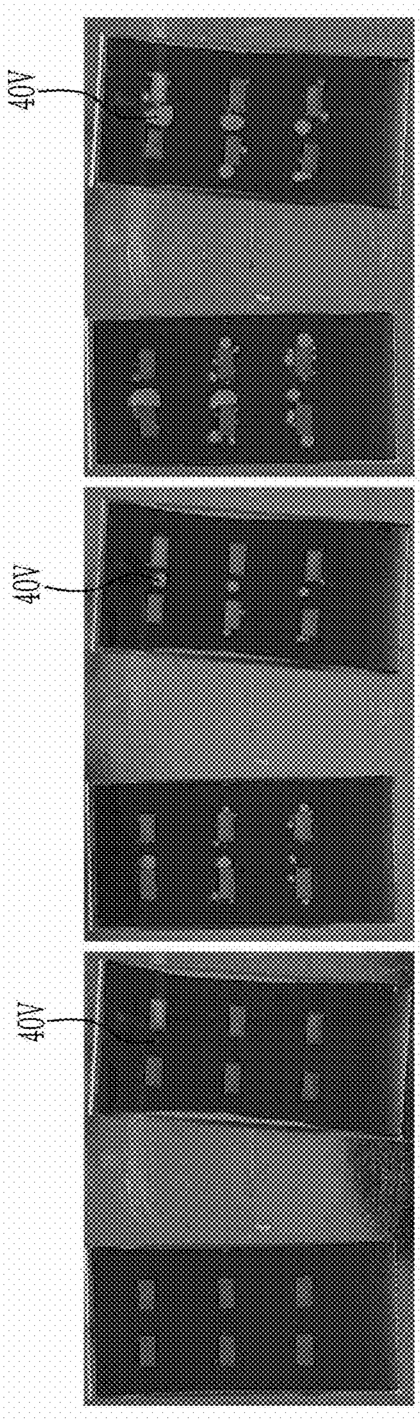
FIG. 3 are images showing a size of an exemplary void in an underfill material according to a surrounding pressure.

FIG. 3 are images showing the size of exemplary voids 40V in the underfill material 40 according to a surrounding pressure.

FIG. 3 (*a*) illustrates the size of the void 40V at an atmospheric pressure, FIG. 3 (*b*) illustrates the size of the void 40V at a pressure of 1000 torr, and FIG. 3 (*c*) illustrates the size of the void 40V at a pressure of 50 torr. Referring to the drawings, it may be seen that the size of the void 40V increases as the surrounding pressure decreases. According to embodiments of the present disclosure, the void 40V in the underfill material 40 may be removed using a change in the size of the void 40V according to the surrounding pressure.

Figure 4:
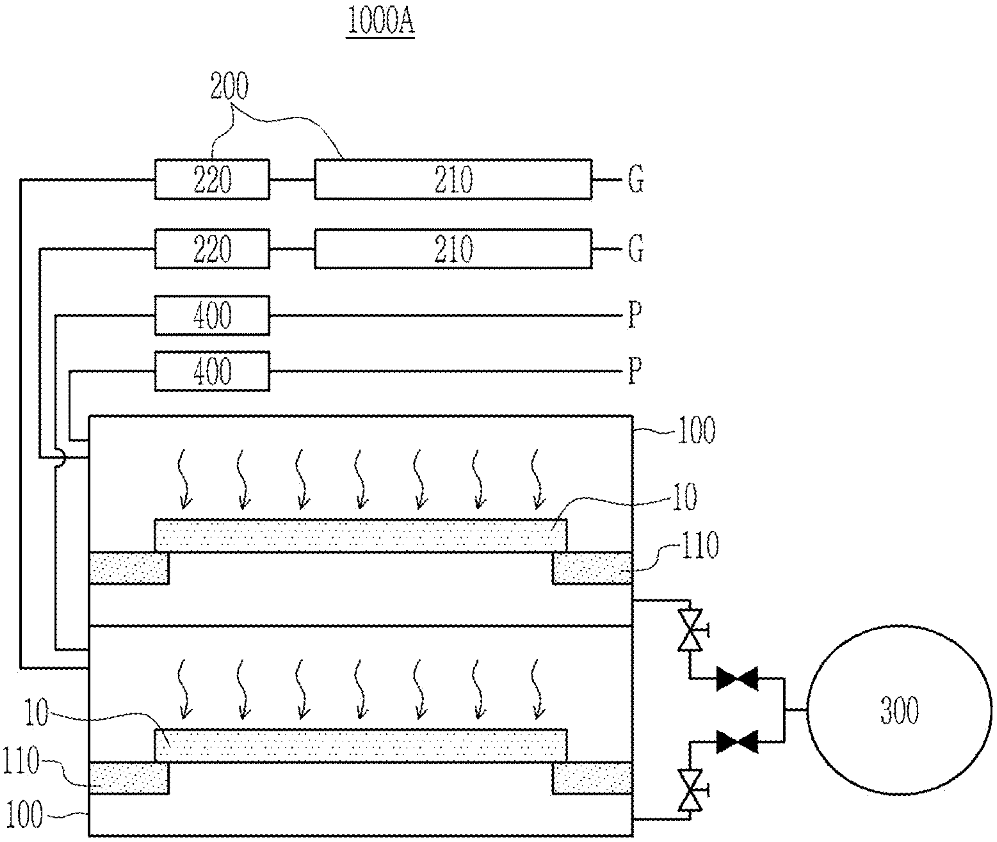
FIG. 4 is a schematic diagram showing a device for removing a void in an underfill material according to an embodiment of the present invention.

FIG. 4 is a schematic diagram showing a device for removing voids 40V in an underfill material 40 according to embodiments of the present invention.

Referring to the drawings, in some embodiments, the device 1000A for removing the void 40V in the underfill material 40 may include a chamber 100 in which the substrate 10 applied with the underfill material 40 is placed, a gas supply device 200 for injecting a gas G into the chamber 100, and a vacuum device 300 for exhausting the gas G to the outside of the chamber 100. In some embodiments, the device 1000A may further include a cleaning device 400 that cleans the inside of the chamber 100. In the drawings, the device 1000A is shown as including two chambers 100, two gas supply devices 200, one vacuum device 300, and two cleaning devices 400, but the number of components included in the device 1000A may be changed.

In some embodiments, the chamber 100 may have a support structure 110 for supporting the substrate 10. In some embodiments, the support structure 110 may be a slot provided to insert the substrate 10 into the chamber 100, but the present disclosure is not limited thereto. In some embodiments, the support structure 110 may be formed of a material with an excellent heat resistance and an excellent insulation characteristic. In some embodiments, the support structure 110 may be maintained at a constant temperature during operation of the device 1000A for removing the void 40V, and a heat loss of the substrate 10 may be prevented as heat is conducted to the support structure 110.

In some embodiments, the gas supply device 200 may be connected to the chamber 100, and may be configured to inject a heated gas G into the chamber 100 in order to create a heating atmosphere and a pressurizing atmosphere inside the chamber 100. In the present specification, in some embodiments, the heated gas G may be a gas having a temperature higher than a room temperature. In some embodiments, the pressurizing atmosphere may be created inside the chamber 100 such that the void 40V of the underfill material 40 is contracted, and the heating atmosphere may be created such that the underfill material 40 has appropriate fluidity. Additionally, in some embodiments, the gas supply device 200 may minimize a temperature change of the underfill material 40 according to a decrease in an internal temperature of the chamber 100 through operation of the vacuum device 300 by injecting the heated gas G. In other words, heated gas G may be injected into the chamber 100 to offset a decrease in internal temperature of the chamber 100 created by the vacuum device 300, thereby minimizing a temperature change of the underfill material 40.

In some embodiments, the gas supply device 200 may include a blower 210 for injecting the gas G into the chamber 100. In some embodiments, the gas supply device 200 may also include a filter 220 for removing any contaminated particles of the gas G. Additionally, in some embodiments, the gas supply device 200 may further include a heating portion (not shown) for heating the gas G. In some embodiments, the gas G injected into the chamber 100 through the gas supply device 200 may be an inert gas such as nitrogen or air.

In some embodiments, to contract the void 40V in the underfill material 40, an internal pressure of the chamber 100 in the pressurizing atmosphere may be greater than or equal to an atmospheric pressure. In the present disclosure, in some embodiments, the pressurizing atmosphere may include an atmospheric pressure environment. However, for sufficient contraction of the void 40V, in some embodiments, the pressurizing atmosphere may be an environment higher than the atmospheric pressure.

For example, in some embodiments, an internal temperature of the chamber 100 in the heating atmosphere may be about 30° C. to about 80° C., about 40° C. to about 70° C., or about 50° C. to about 60° C. If the internal temperature of the chamber 100 is too low, it may be difficult to secure fluidity of the underfill material 40, and if the internal temperature of the chamber 100 is too high, the underfill material 40 may be cured (or hardened). Thus, in some embodiments, the internal temperature of the chamber 100 may be controlled within the above-described temperature ranges.

In some embodiments, in the heating atmosphere, the substrate 10 and the underfill material 40 may be heated through convective heat transfer, and temperatures of the substrate 10 and the underfill material 40 may be substantially the same as the internal temperature of the chamber 100.

In some embodiments, a viscosity of the underfill material 40 in the heating atmosphere may be about 0.25 Pa·s to about 0.8 Pa·s. If the viscosity of the underfill material 40 is too low, it may be difficult to uniformly fill the underfill material 40, and if the viscosity of the underfill material 40 is too high, it may be difficult to secure fluidity of the underfill material 40. Thus, in some embodiments, the viscosity of the underfill material 40 may be controlled within the above-described range.

In some embodiments, an operating time required for the gas supply device 200 to create the heating atmosphere and/or the pressurizing atmosphere inside the chamber 100 may be about 5 minutes or less, about 4 minutes or less, about 3 minutes or less, about 2 minutes or less, about 1 minute or less, or about 30 seconds or less. According to the present disclosure, in some embodiments, the gas G may be injected from the outside of the chamber 100 to the inside of the chamber 100, so that the heating atmosphere and/or the pressurizing atmosphere is created inside the chamber 100 at a high speed.

In some embodiments, the vacuum device 300 may be connected to the chamber 100, and may create a vacuum atmosphere inside the chamber 100 by exhausting the gas G to the outside of the chamber 100. In some embodiments, the vacuum atmosphere may be created inside the chamber 100 so that the void 40V of the underfill material 40 is expanded and the void 40V is removed by moving to an outer direction of the underfill material 40 (i.e., moving toward an outer edge of the underfill material 40) (see also FIG. 11). Additionally, in some embodiments, the vacuum atmosphere may be created inside the chamber 100 so that the gas G with an appropriate pressure range is introduced from the gas supply device 200. In some embodiments, the vacuum device 300 may include a pump.

In some embodiments, the internal pressure inside the chamber 100 in the vacuum atmosphere may be about 10 torr or less, about 9 torr or less, about 8 torr or less, about 7 torr or less, about 6 torr or less, about 5 torr or less, about 4 torr or less, about 3 torr or less, about 2 torr or less, or about 1 torr or less. For sufficient expansion and movement of the void 40V in the underfill material 40, in some embodiments, the internal pressure of the chamber 100 in the vacuum atmosphere may be about 1 torr. For example, in some embodiments, the internal pressure of the chamber 100 in the vacuum atmosphere may be about 0.1 torr to about 1.9 torr, about 0.2 torr to about 1.8 torr, about 0.3 torr to about 1.7 torr, about 0.4 torr to about 1.6 torr, about 0.5 torr to about 1.5 torr, about 0.6 torr to about 1.4 torr, about 0.7 torr to about 1.3 torr, about 0.8 torr to about 1.2 torr, about 0.9 torr to about 1.1 torr, or about 1 torr.

In some embodiments, an operating time required for the vacuum device 300 to create the vacuum atmosphere inside the chamber 100 may be about 5 minutes or less, about 4 minutes or less, about 3 minutes or less, about 2 minutes or less, about 1 minute or less, or about 30 seconds or less. According to the present disclosure, in some embodiments, the gas G may be exhausted from the inside of the chamber 100 to the outside of the chamber 100, so that the vacuum atmosphere is created at a high speed and the internal pressure of the chamber 100 is significantly lowered.

Because the vacuum device 300 and the gas supply device 200 operate for one or more cycles, in some embodiments, the vacuum atmosphere and the pressurizing atmosphere may be alternately created inside the chamber 100. Here, in some embodiments, in the one cycle, the vacuum device 300 and the gas supply device 200 may be alternately operated once. In some embodiments, the vacuum device 300 and the gas supply device 200 may operate for one or more cycles after the substrate 10 is placed into the chamber 100, and as described later, in some embodiments, may operate for one or more cycles before the substrate 10 is placed into the chamber 100. In some embodiments, in the cycle, the vacuum device 300 may operate first, and the gas supply device 200 may operate later, but an order of their operations is not particularly limited. Additionally, in some embodiments, after the cycle ends, one of the vacuum device 300 and the gas supply device 200 may be additionally operated. For example, in some embodiments, after the substrate 10 is placed into the chamber 100, the vacuum device 300 and the gas supply device 200 may operate for one cycle, and the vacuum device 300 may additionally operate. According to the present disclosure, in some embodiments, the void 40V in the underfill material 40 may be removed by alternately creating the vacuum atmosphere and the pressurizing atmosphere inside the chamber 100 to repeat expansion and contraction of the void 40V in the underfill material 40. In addition, according to the present disclosure, in some embodiments, the internal pressure of the chamber 100 may be significantly and quickly changed through injection and exhaust of the gas G into and out of the chamber 100. Accordingly, it is possible to efficiently remove the void 40V in the underfill material 40 by quickly inducing a change in volume and motion of the void 40V.

On the other hand, in some embodiments, in order to create the heating atmosphere inside the chamber 100, the gas supply device 200 may be operated even before the substrate 10 is placed into the chamber 100. In order to create a sufficient heating atmosphere inside the chamber 100, in some embodiments, an operating time of the gas supply device 200 before the substrate 10 is placed inside the chamber 100 may be longer than an operating time of the gas supply device 200 after the substrate 10 is placed into the chamber 100. For example, in some embodiments, the operating time of the gas supply device 200 before the substrate 10 is placed into the chamber 100 may be about 5 minutes or less, but the present disclosure is not limited thereto.

For injection of the gas G through the gas supply device 200, in some embodiments, an operation of the vacuum device 300 may be preceded. In some embodiments, an operating time of the vacuum device 300 before the substrate 10 is placed into the chamber 100 and the gas supply device 200 is operated may be about 5 minutes or less, about 4 minutes or less, about 3 minutes or less, about 2 minutes or less, about 1 minute or less, or about 30 seconds or less. In addition, in some embodiments, an internal pressure of the chamber 100 in the vacuum atmosphere created by the vacuum device 300 may be about 10 torr or less, about 9 torr or less, about 8 torr or less, about 7 torr or less, about 6 torr or less, about 5 torr or less, about 4 torr or less, about 3 torr or less, about 2 torr or less, about 1 torr or less, or about 1 torr. For example, the internal pressure of the chamber 100 in the vacuum atmosphere may be about 0.1 torr to about 1.9 torr, about 0.2 torr to about 1.8 torr, about 0.3 torr to about 1.7 torr, about 0.4 torr to about 1.6 torr, about 0.5 torr to about 1.5 torr, about 0.6 torr to about 1.4 torr, about 0.7 torr to about 1.3 torr, about 0.8 torr to about 1.2 torr, about 0.9 torr to about 1.1 torr, or about 1 torr.

In some embodiments, the cleaning device 400 may be connected to the chamber 100, and may clean the inside of the chamber 100 with plasma P. In some embodiments, the cleaning device 400 may be an in-situ cleaning device that generates the plasma P inside the chamber 100, and in some embodiments, may be a remote cleaning device that generates the plasma P from a remote plasma source (RPS) that is a supply source distinguished from the chamber 100 to supply the plasma P to the inside of the chamber 100.

Figure 5:
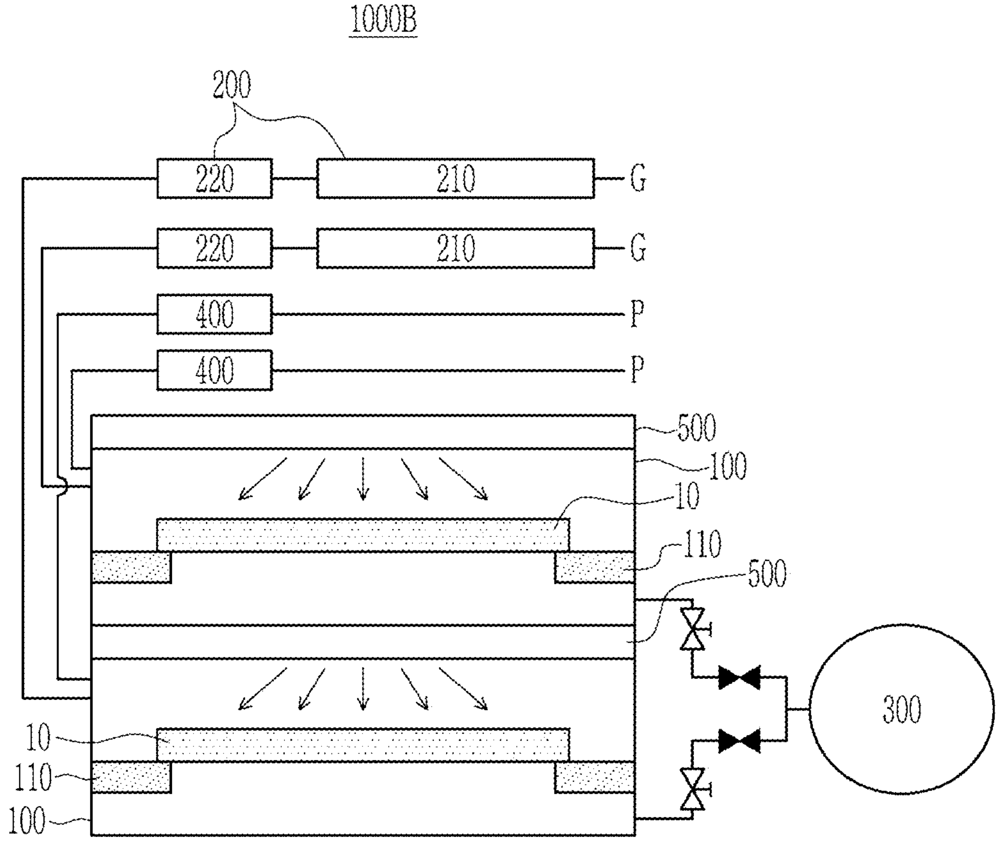
FIG. 5 is a schematic diagram showing a device for removing a void in an underfill material according to an embodiment of the present invention.

FIG. 5 is a schematic diagram showing a device for removing a void 40V in an underfill material 40 according to embodiments of the present invention.

As shown in FIG. 5, the device 1000B of removing the void 40V in the underfill material 40 further includes a heating device 500 compared with the device 1000A for removing the void 40V in the underfill material 40.

In some embodiments, the heating device 500 may be disposed inside the chamber 100, and may directly heat the substrate 10 placed into the chamber 100. In some embodiments, the heating device 500 may heat the substrate 10 by irradiating light to the substrate 10, and for example, the heating device 500 may be an infrared (IR) lamp, but the present disclosure is not limited thereto.

In some embodiments, the heating device 500 may heat the substrate 10 applied with the underfill material 40 through radiant heat transfer, and for example, may heat the substrate 10 applied with the underfill material 40 to about 30° C. to about 80° C., about 40° C. to about 70° C., or about 50° C. to about 60° C.

In some embodiments, the gas supply device 200 may create the pressurizing atmosphere inside the chamber 100 by injecting the gas G into the chamber 100. In some embodiments, the pressurizing atmosphere may be created inside the chamber 100 so that the void 40V of the underfill material 40 is contracted.

In some embodiments, the gas G injected into the chamber 100 through the gas supply device 200 may be in a heated state. In some embodiments, the heating device 500 may heat the substrate 10 together with the gas supply device 200. For example, if it is difficult to sufficiently heat the substrate 10 with the gas supply device 200, in some embodiments, the heating device 500 may further heat the substrate 10 together with the gas supply device 200. As another example, in some embodiments, the heating device 500 may prevent a decrease in a temperature of the substrate 10 if an internal temperature inside of the chamber 100 decreases due to operation of the vacuum device 300.

In some embodiments, the gas G injected into the chamber 100 through the gas supply device 200 may be in an unheated state. In some embodiments, the heating device 500 may heat the substrate 10 so that the underfill material 40 has appropriate fluidity.

Descriptions of other components may be identically applied to the description of the device 1000A for removing the void 40V in the underfill material 40 and duplicate discussion thereof may be omitted herein.

Figure 6:
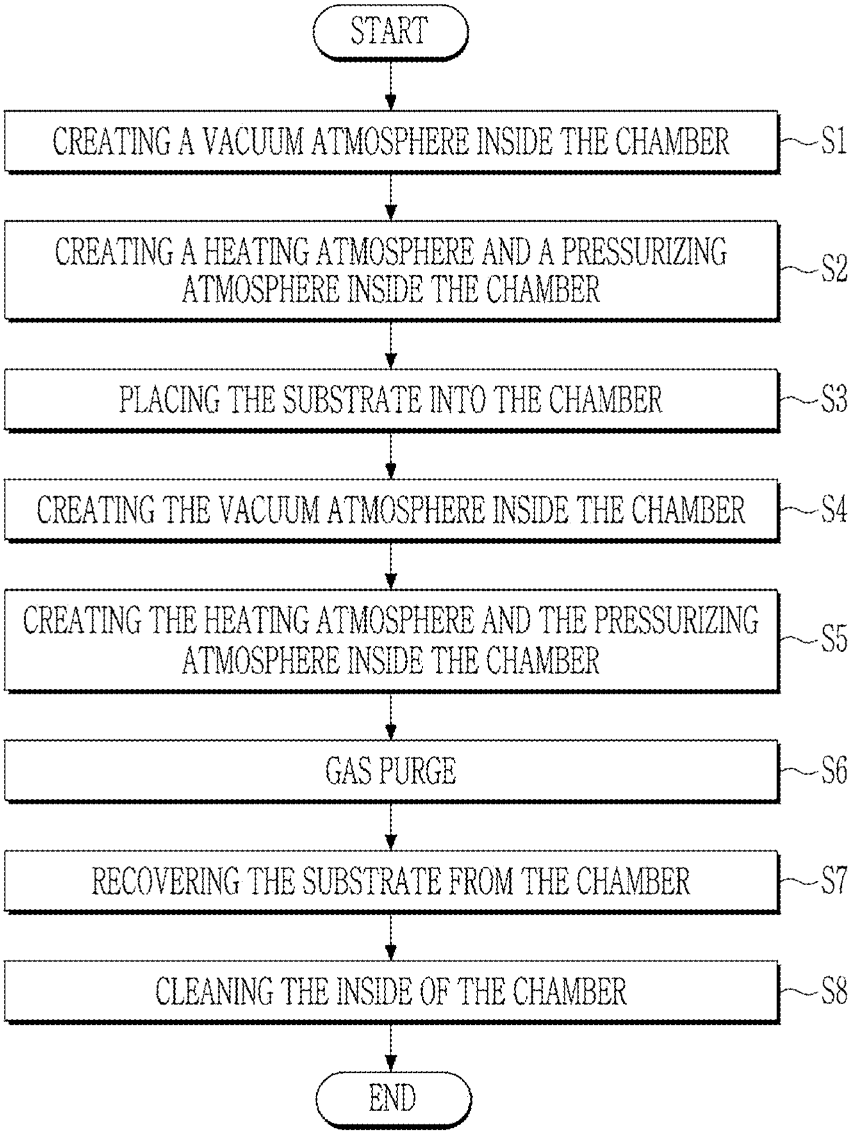
FIG. 6 is a flowchart showing a method for removing a void in an underfill material according to an embodiment of the present invention.

FIG. 6 is a flowchart showing a method for removing a void 40V in an underfill 40 material according to embodiments of the present invention.

FIGS. 7 to 15 are schematic views illustrating the method for removing the void 40V in the underfill material 40 according to embodiments of the present invention.

First, referring to FIG. 6, in some embodiments, the method for removing the void 40V in the underfill material 40 may include a step S1 of creating a vacuum atmosphere inside the chamber 100, a step S2 of creating a heating atmosphere and a pressurizing atmosphere inside the chamber 100, a step S3 of placing the substrate 10 applied with the underfill material 40 into the chamber 100, a step S4 of creating the vacuum atmosphere inside the chamber 100 again, a step S5 of creating the heating atmosphere and the pressurizing atmosphere inside the chamber 100, a gas purge step S6, a step S7 of recovering the substrate 10 from the chamber 100, and a step S8 of cleaning the inside of the chamber 100.

In some embodiments, the step S1 of creating the vacuum atmosphere inside the chamber 100 and the step S2 of creating the heating atmosphere and the pressurizing atmosphere inside the chamber 100 may create the heating atmosphere before the substrate 10 is placed into the chamber 100, such that the heating atmosphere and pressurizing atmosphere heat the substrate 10 placed into the chamber 100.

In some embodiments, the step S1 of creating the vacuum atmosphere inside the chamber 100 may be performed by exhausting the gas G to the outside of the chamber 100 using a pump or the like. In some embodiments, the step S1 of creating the vacuum atmosphere inside the chamber 100 may be a preceding step for the step S2 of creating the heating atmosphere and the pressurizing atmosphere inside the chamber 100. The vacuum atmosphere may be created inside the chamber 100 so that the gas G with an appropriate pressure range is introduced from the gas supply device 200 into the chamber 100. However, if necessary, in some embodiments, the step S1 of creating the vacuum atmosphere may be omitted.

In some embodiments, an internal pressure of the chamber 100 in the vacuum atmosphere may be about 10 torr or less, about 9 torr or less, about 8 torr or less, about 7 torr or less, about 6 torr or less, about 5 torr or less, about 4 torr or less, about 3 torr or less, about 2 torr or less, or about 1 torr or less. For sufficient expansion and movement of the void 40V in the underfill material 40, in some embodiments, the internal pressure of the chamber 100 in the vacuum atmosphere may be about 1 torr. For example, in some embodiments, the internal pressure of the chamber 100 in the vacuum atmosphere may be about 0.1 torr to about 1.9 torr, about 0.2 torr to about 1.8 torr, about 0.3 torr to about 1.7 torr, about 0.4 torr to about 1.6 torr, about 0.5 torr to about 1.5 torr, about 0.6 torr to about 1.4 torr, about 0.7 torr to about 1.3 torr, about 0.8 torr to about 1.2 torr, about 0.9 torr to about 1.1 torr, or about 1 torr.

In some embodiments, in the step S1 of creating the vacuum atmosphere inside the chamber 100, a time required to create the vacuum atmosphere inside the chamber 100 may be about 5 minutes or less, about 4 minutes or less, about 3 minutes or less, about 2 minutes or less, about 1 minute or less, or about 30 seconds or less. According to the present disclosure, in some embodiments, the gas G may be exhausted from the inside and the outside of the chamber 100, so that the vacuum atmosphere is created at a high speed and the internal pressure of the chamber 100 is significantly lowered.

In some embodiments, the step S2 of creating the heating atmosphere and the pressurizing atmosphere inside the chamber 100 may be performed by injecting a heated gas G into the chamber 100. In some embodiments, the gas G injected into the chamber 100 may be an inert gas such as nitrogen or air.

In some embodiments, to contract the void 40V, an internal pressure of the chamber 100 in the pressurizing atmosphere may be greater than or equal to an atmospheric pressure. In the present disclosure, in some embodiments, the pressurizing atmosphere may mean an environment greater than or equal to the atmospheric pressure.

For example, in some embodiments, an internal temperature of the chamber 100 in the heating atmosphere may be about 30° C. to about 80° C., about 40° C. to about 70° C., or about 50° C. to about 60° C. If the internal temperature of the chamber 100 is too low, it may be difficult to secure fluidity of the underfill material 40, and if the internal temperature of the chamber 100 is too high, the underfill material 40 may be cured (or hardened). Thus, in some embodiments, the internal temperature of the chamber 100 may be controlled within the above-described temperature ranges.

In some embodiments, in the heating atmosphere, the substrate 10 and the underfill material 40 may be heated through convective heat transfer, and temperatures of the substrate 10 and the underfill material 40 may be substantially the same as the internal temperature of the chamber 100.

In some embodiments, a viscosity of the underfill material 40 in the heating atmosphere may be about 0.25 Pa·s to about 0.8 Pa·s. If the viscosity of the underfill material 40 is too low, it may be difficult to uniformly fill the underfill material 40, and if the viscosity of the underfill material 40 is too high, it may be difficult to secure fluidity of the underfill material 40. Thus, in some embodiments, the viscosity of the underfill material 40 may be controlled within the above-described range.

In some embodiments, in the step S2 of creating the heating atmosphere and the pressurizing atmosphere inside the chamber 100, a time required to create the heating atmosphere and/or the pressurizing atmosphere inside the chamber 100 may be about 5 minutes or less, about 4 minutes or less, about 3 minutes or less, about 2 minutes or less, about 1 minute or less, or about 30 seconds or less. According to the present disclosure, in some embodiments, the gas G may be injected from the outside of the chamber 100 to the inside of the chamber 100, so that the heating atmosphere and/or the pressurizing atmosphere is created inside the chamber 100 at a high speed.

On the other hand, in some embodiments in which the substrate 10 is heated using only the heating device 500, the step S1 of creating the vacuum atmosphere inside the chamber 100 and the step S2 of creating the heating atmosphere and the pressurizing atmosphere may be omitted, and the substrate 10 placed into the chamber 100 may be heated by light. For example, in some embodiments, the substrate 10 placed into the chamber 100 may be heated to about 30° C. to about 80° C., about 40° C. to about 70° C., or about 50° C. to about 60° C. by light irradiation.

Figure 7:
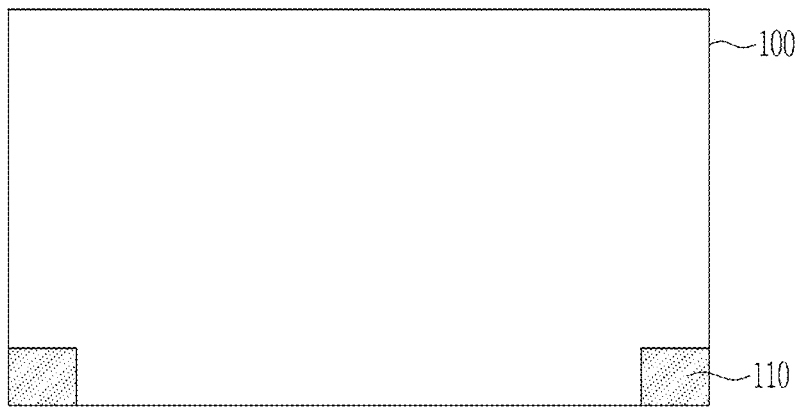
FIGS. 7 to 15 are schematic views for describing the method for removing the void in the underfill material according to an embodiment of the present invention.
Figure 8:
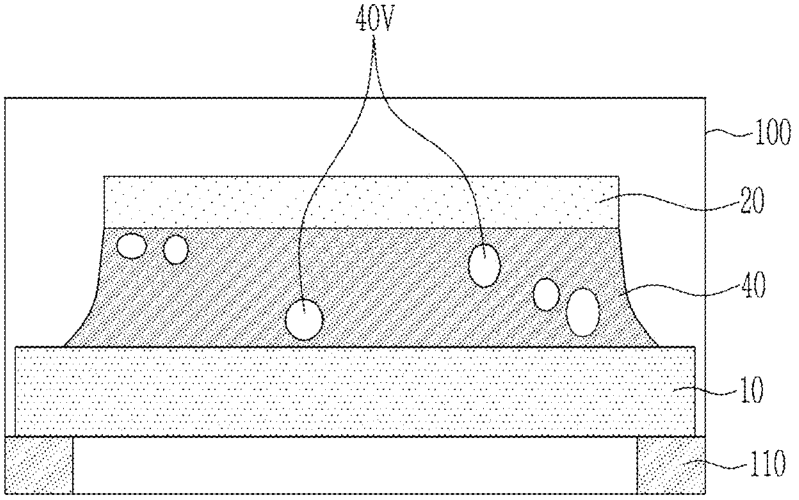

Referring to FIG. 7 and FIG. 8, in some embodiments, the step S3 of placing the substrate 10 applied with the underfill material 40 into the chamber 100 may be performed by disposing the substrate 10 on the support structure 110 of the chamber 100. In some embodiments, before the step S3 of putting the substrate 10 is performed, the step S1 of creating the vacuum atmosphere inside the chamber 100 and the step S2 of creating the heating atmosphere and the pressurizing atmosphere inside the chamber 100 may be preceded, so that the substrate 10 may be placed into the chamber 100 already having the heating atmosphere.

Figure 9:
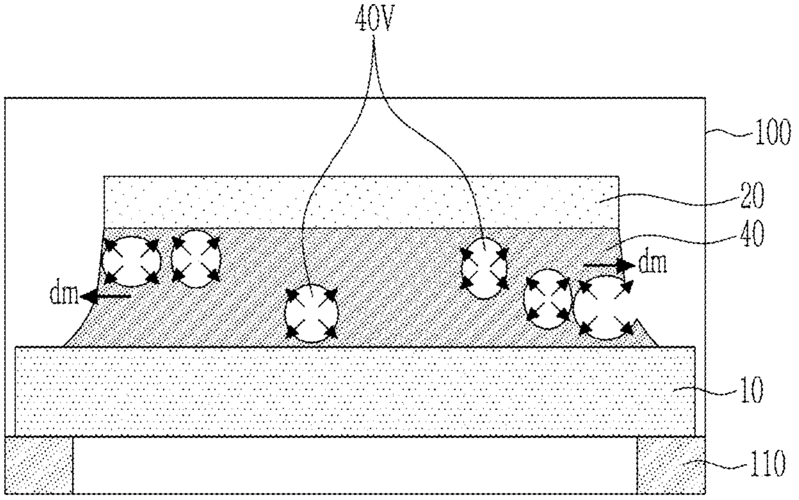

Referring to FIG. 9, in some embodiments, the step S4 of creating the vacuum atmosphere inside the chamber 100 may be performed by exhausting the gas G to the outside of the chamber 100 using a pump or the like. In some embodiments, the void 40V of the underfill material 40 may be expanded through the step S4 of creating the vacuum atmosphere inside the chamber 100, and the void 40V may be removed by moving to an outer direction (dm) of the underfill material 40 (i.e., moving toward an outer edge of the underfill material 40). Additionally, in some embodiments, the vacuum atmosphere may be created inside the chamber 100 so that the gas G with an appropriate pressure range is introduced from the gas supply device 200 into the chamber 100.

In addition to the above description, in some embodiments, a description of the step S4 of creating the vacuum atmosphere inside the chamber 100 may be equally applied to a description of the step S1 of creating the vacuum atmosphere inside the chamber 100 unless there is a particularly contradictory description.

Figure 10:
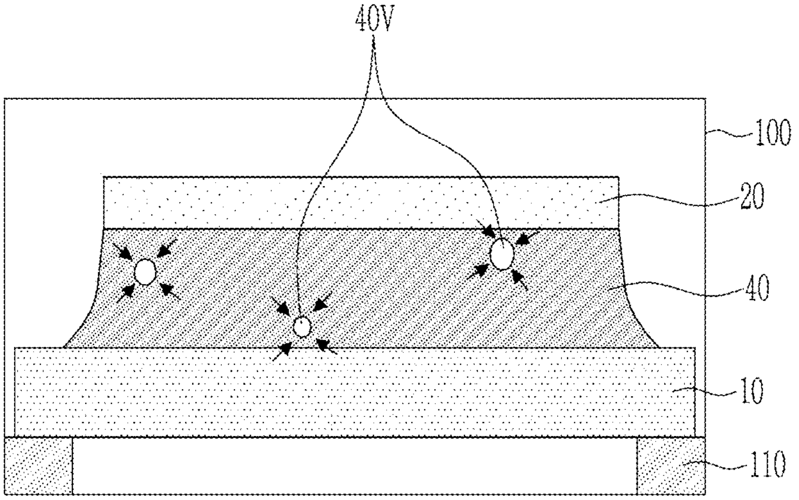

Referring to FIG. 10, in some embodiments, the step S5 of creating the heating atmosphere and the pressurizing atmosphere inside the chamber 100 may be performed by injecting a heated gas G into the chamber 100. In some embodiments, the underfill material 40 may maintain appropriate fluidity through the step S5 of creating the heating atmosphere and the pressurizing atmosphere inside the chamber 100, and the void 40V of the underfill material 40 may be contracted. In addition, in some embodiments, the step S5 of creating the heating atmosphere and the pressurizing atmosphere inside the chamber 100 may minimize a temperature change of the underfill material 40 according to a decrease in an internal temperature of the chamber 100 due to the step S4 of creating the vacuum atmosphere.

On the other hand, in some embodiments in which the substrate 10 is heated using only the heating device 500, the step S5 of creating the heating atmosphere and the pressurizing atmosphere inside the chamber 100 may be replaced by a step of creating only the pressurizing atmosphere without creating the heating atmosphere. In some embodiments, the step of creating the pressurizing atmosphere may be performed by injecting an unheated gas G into the chamber 100.

In addition to the above description, in some embodiments, a description of the step S5 of creating the heating atmosphere and the pressurizing atmosphere inside the chamber 100 may be equally applied to a description of the step S2 of creating the heating atmosphere and the pressurizing atmosphere inside the chamber 100 unless there is a particularly contradictory description.

Figure 11:
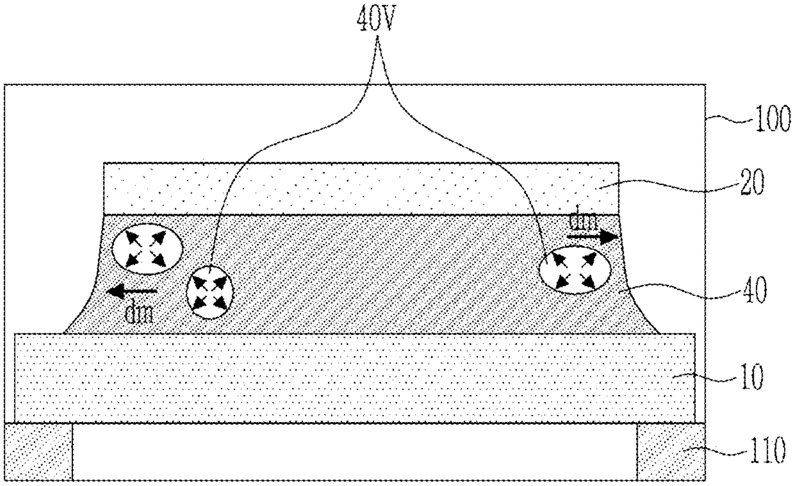
Figure 12:
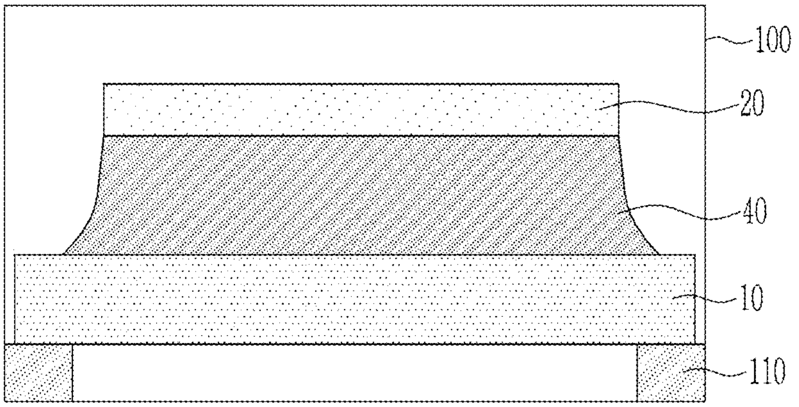

In some embodiments, the step S4 of creating the vacuum atmosphere inside the chamber 100 and the step S5 of creating the heating atmosphere and the pressurizing atmosphere may be performed for one or more cycles so that the vacuum atmosphere, the heating atmosphere, and the pressurizing atmosphere are alternately created inside the chamber 100 after the substrate 10 is placed into the chamber 100. Here, in some embodiments, in the one cycle, the step S4 of creating the vacuum atmosphere inside the chamber 100 and the step S5 of creating the heating atmosphere and the pressurizing atmosphere may be alternately performed once. Therefore, in some embodiments, the vacuum atmosphere and the pressurizing atmosphere may be alternately created inside the chamber 100. In some embodiments, in the cycle, the step S4 of creating the vacuum atmosphere may be performed first, and the step S5 of creating the heating atmosphere and the pressurizing atmosphere may be performed later, but their order is not particularly limited. In addition, in some embodiments, after the cycle ends, one of the step S4 of creating the vacuum atmosphere and the step S5 of creating the heating atmosphere and the pressurizing atmosphere may be additionally performed. For example, as shown in FIGS. 9 to 11, in some embodiments, after the substrate 10 is placed into the chamber 100, the step S4 of creating the vacuum atmosphere and the step S5 of creating the heating atmosphere and the pressurizing atmosphere may be performed for one cycle, and the step S4 of creating the vacuum atmosphere may be additionally performed. According to the present disclosure, in some embodiments, the void 40V may be removed by alternately creating the vacuum atmosphere and the pressurizing atmosphere inside the chamber 100 to repeat expansion and contraction of the void 40V of the underfill material 40 (see FIG. 12). In addition, according to the present disclosure, in some embodiments, an internal pressure of the chamber 100 may be significantly and quickly changed through injection and exhaust of the gas G. Accordingly, it is possible to efficiently remove the void 40V by quickly inducing a change in volume and motion of the void 40V.

In some embodiments, the gas purge step S6 may be performed by injecting a purge gas such as nitrogen or the like into the chamber 100. In some embodiments, the gas purge step S6 may be performed to restore an atmospheric pressure condition in the chamber 100 and remove a chemical reaction from the chamber 100. In some embodiments, the gas purge step S6 may be replaced by the step S5 of creating the pressurizing atmosphere.

In some embodiments, after the step S7 of recovering the substrate 10 from the chamber 100, a curing step for curing the underfill material 40 may be performed. In some embodiments, the curing step for curing the underfill material 40 may be performed inside the chamber 100 before the step S7 of recovering the substrate 10 from the chamber 100 is performed.

Figure 13:
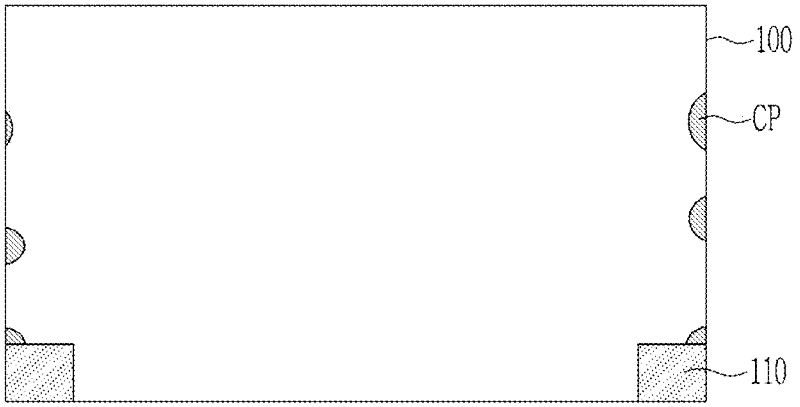
Figure 14:
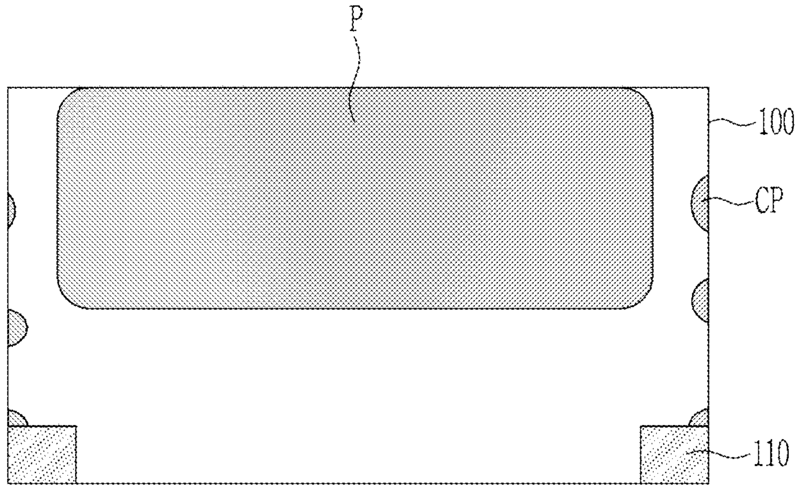
Figure 15:
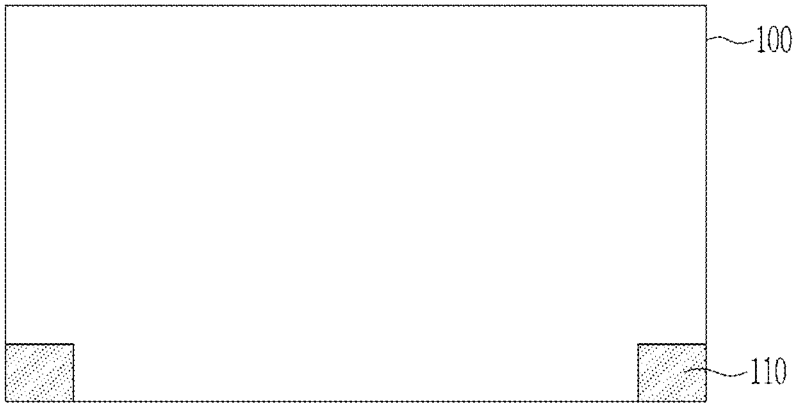

Referring to FIGS. 13 to 15, because the gas G is supplied into the chamber 100, in some embodiments, a wall surface or the like of the chamber 100 may be contaminated with a contaminated particle (CP) caused by the underfill material 40 or the like, and the step S8 of cleaning the inside of the chamber 100 may be additionally performed to remove the contaminated particle CP. In some embodiments, in the step S8 of cleaning the inside of the chamber 100, an in-situ cleaning method in which plasma P is generated inside the chamber 100 may be used, or a remote cleaning method in which plasma P is generated from a remote plasma source (RPS) that is a supply source distinguished from the chamber 100 to supply the plasma P into the chamber 100 may be used.

Figure 16:
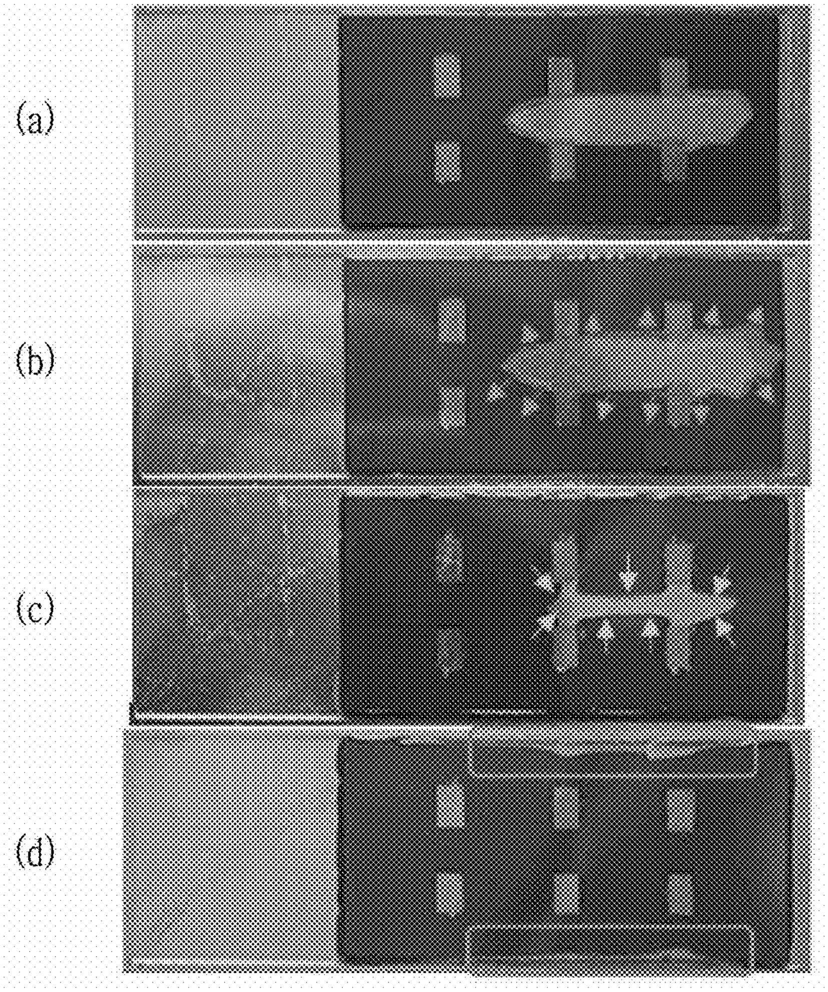
FIG. 16 are images showing an exemplary process in which the void is removed through the device for removing the void in the underfill material according to an embodiment of the present invention.

FIG. 16 are images illustrating a process in which the void 40V is removed through the device for removing the void 40V in the underfill material 40 according to embodiments of the present invention.

In some embodiments, in an atmospheric pressure condition, the void 40V of the underfill material 40 may be created (see FIG. 16 (*a*)). According to embodiments of the present invention, the void 40V may be expanded in the vacuum atmosphere (see FIG. 16 (*b*)) and may be contracted in the pressurizing atmosphere (see FIG. 16 (*c*)) so that the void 40V may be completely removed from the underfill material 40 by moving the void 40V in an outer direction of the underfill material 40 when the atmospheric pressure condition is finally restored (i.e., moving the void 40V toward an outer edge of the underfill material 40).

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims. The above-disclosed subject matter is to be considered illustrative, and not restrictive, and the appended claims are intended to cover all such modifications, enhancements, and other embodiments, which fall within the scope of the present inventive concept. Thus, to the maximum extent allowed by law, the scope it to be determined by the broadest permissible interpretation of the following claims and their equivalents, and shall not be restricted or limited by the foregoing detailed description.

What is claimed is:

1. A device for removing a void in an underfill material, the device comprising:

a chamber configured to accept a substrate applied with an underfill material therein;

a gas supply device connected to the chamber and configured to inject a heated gas into the chamber to create a heating atmosphere and a pressurizing atmosphere inside the chamber; and a vacuum device connected to the chamber and configured to exhaust a gas from the inside of the chamber to outside of the chamber to create a vacuum atmosphere inside the chamber, wherein the vacuum device and the gas supply device are configured to alternately operate for one or more cycles to create the vacuum atmosphere and the pressurizing atmosphere inside the chamber, and during each cycle of the one or more cycles, the vacuum device and the gas supply device are configured to alternately operate once.

2. The device of claim 1, wherein an internal pressure of the chamber in the vacuum atmosphere is 10 torr or less, and an internal pressure of the chamber in the pressurizing atmosphere is greater than or equal to an atmospheric pressure.

3. The device of claim 2, wherein the internal pressure of the chamber in the vacuum atmosphere is 1 torr or less.

4. The device of claim 1, wherein the vacuum device and the gas supply device are configured to operate for one or more cycles before and after the substrate is placed into the chamber.

5. The device of claim 1, wherein an operating time required for the vacuum device to create the vacuum atmosphere inside the chamber is 5 minutes or less.

6. The device of claim 1, wherein the gas supply device comprises a blower and a filter.

7. The device of claim 1, wherein the heated gas to be injected into the chamber through the gas supply device is nitrogen or air.

8. The device of claim 1, wherein an internal temperature of the chamber in the heating atmosphere is 30° C. to 80° C.

9. The device of claim 1, wherein a viscosity of the underfill material in the heating atmosphere is 0.25 Pa·s to 0.8 Pa·s.

10. The device of claim 1, wherein an operating time required for the gas supply device to create the heating atmosphere and the pressurizing atmosphere inside the chamber is 5 minutes or less.

11. The device of claim 1, further comprising a heating device disposed inside the chamber and configured to heat the substrate by irradiating light to the substrate.

12. The device of claim 1, further comprising a cleaning device connected to the chamber and configured to clean the inside of the chamber with a plasma.

13. A device for removing a void in an underfill material, comprising:

a chamber configured to accept a substrate applied with an underfill material therein;

a gas supply device connected to the chamber and configured to inject a first gas into the chamber to create a pressurizing atmosphere inside the chamber;

a vacuum device connected to the chamber and configured to exhaust a second gas from the inside of the chamber to outside of the chamber to create a vacuum atmosphere inside the chamber; and a heating device disposed inside the chamber and configured to heat the substrate by irradiating light to the substrate, wherein the vacuum device and the gas supply device are configured to alternately operate once during each cycle of one or more cycles to create the vacuum atmosphere and the pressurizing atmosphere inside the chamber.

14. The device of claim 13, wherein the heating device is an infrared (IR) lamp.

15. The device of claim 13, wherein an internal pressure of the chamber in the vacuum atmosphere is 10 torr or less, and an internal pressure of the chamber in the pressurizing atmosphere is greater than or equal to an atmospheric pressure.

16. The device of claim 13, wherein an operating time required for the vacuum device to create the vacuum atmosphere inside the chamber is 5 minutes or less.

17. The device of claim 13, wherein an operating time required for the gas supply device to create the pressurizing atmosphere inside the chamber is 5 minutes or less.

18. A device for removing a void in an underfill material, comprising:

a chamber configured to accept a substrate applied with an underfill material therein;

a gas supply device connected to the chamber and configured to inject a first gas into the chamber to create a pressurizing atmosphere inside the chamber; and a vacuum device connected to the chamber and configured to exhaust a second gas from the inside of the chamber to outside of the chamber to create a vacuum atmosphere inside the chamber, wherein the vacuum device and the gas supply device are configured to alternately operate once during each cycle of one or more cycles to create the vacuum atmosphere and the pressurizing atmosphere inside the chamber, and wherein an internal pressure of the chamber in the vacuum atmosphere is 10 torr or less.

19. The device of claim 18, wherein the first gas to be injected into the gas supply device is a heated gas.

20. The device of claim 18, further comprising a heating device disposed inside the chamber and configured to heat the substrate.

* * * * *